United States Patent
Chung et al.

(10) Patent No.: US 7,133,318 B2
(45) Date of Patent: Nov. 7, 2006

(54) OUTPUT DRIVER CAPABLE OF CONTROLLING SLEW RATE OF OUTPUT SIGNAL ACCORDING TO OPERATING FREQUENCY INFORMATION OR CAS LATENCY INFORMATION

(75) Inventors: Hoe-ju Chung, Kyungki-do (KR); Kyu-hyoun Kim, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/339,120

(22) Filed: Jan. 23, 2006

(65) Prior Publication Data

US 2006/0120180 A1   Jun. 8, 2006

Related U.S. Application Data

(62) Division of application No. 10/631,412, filed on Jul. 30, 2003, now Pat. No. 7,035,148.

(30) Foreign Application Priority Data

Oct. 17, 2002  (KR) .......................... 10-2002-63475

(51) Int. Cl.
   *G11C 7/00* (2006.01)
(52) U.S. Cl. ..................... 365/189.05; 326/87
(58) Field of Classification Search ........... 365/189.05; 326/87
   See application file for complete search history.

(56) References Cited

U.S. PATENT DOCUMENTS 5,220,216 A    6/1993  Woo
5,783,956 A    7/1998  Ooishi
5,917,758 A    6/1999  Keeth
6,054,885 A    4/2000  Ooishi et al.
6,362,656 B1   3/2002  Rhee
6,404,258 B1   6/2002  Ooishi
6,646,483 B1 * 11/2003  Shin .......................... 327/112

FOREIGN PATENT DOCUMENTS

JP    2001-292056    10/2001

* cited by examiner

*Primary Examiner*—Hoai V. Ho
(74) *Attorney, Agent, or Firm*—Marger Johnson & McCollom, P.C.

(57) ABSTRACT

An output driver effectively controls the slew rate of an output signal according to CAS latency information including frequency information of an operating clock signal or according to frequency information obtained by detecting the frequency of the operating clock signal. The output driver includes an output terminal, a pull-up driver which pulls-up the output terminal, and a pull-down driver which pulls-down the output terminal. Also, the output driver further includes a mode register set (MRS) which stores CAS latency information of the semiconductor memory device. Driving capabilities of the pull-up driver and the pull-down driver are varied in response to the CAS latency information. The output driver may include a frequency detector which detects and stores the operating frequency of the semiconductor memory device. In this case, the driving capabilities of the pull-up driver and the pull-down driver are varied in response to output signals output from the frequency detector.

4 Claims, 2 Drawing Sheets

OUTPUT DRIVER CAPABLE OF CONTROLLING SLEW RATE OF OUTPUT SIGNAL ACCORDING TO OPERATING FREQUENCY INFORMATION OR CAS LATENCY INFORMATION

CROSS REFERENCE TO RELATED APPLICATIONS

This application is a Divisional of U.S. patent application Ser. No. 10/631,412, filed Jul. 30, 2003, now U.S. Pat. No. 7,035,148, which claims priority from Korean Patent Application No. 2002-63475, filed on Oct. 17, 2002, which is incorporated by reference in its entirety.

BACKGROUND OF THE INVENTION

1. Field of the Invention

This disclosure relates to the field of semiconductor memory devices, and more particularly, to an output driver of a semiconductor memory device.

2. Description of the Related Art

When a semiconductor memory device is used in a system, load on an output terminal, i.e., an output pad, of the semiconductor memory device is large. Thus, a semiconductor memory device includes an output driver for driving an output pad. In a synchronous system, the slew rate of a signal output from an output driver has a close relationship to signal integrity, such as causing the switching noise of a system. In general, as the operating frequency increases, signal integrity decreases. Thus, the slew rate of an output signal of an output driver should be controlled based on a frequency resulting in the lowest signal integrity when a memory system that operates in a wide frequency range is designed.

However, in conventional output drivers, the correlation between operating frequency and slew rate is not considered. The driving capability of the conventional output driver is preset by the sizes of a pull-up transistor and a pull-down transistor. Accordingly, the conventional output driver cannot effectively control the slew rate of the output signal according to a variation in the operating frequency.

Embodiments of the invention address these and other disadvantages of the conventional art.

SUMMARY OF THE INVENTION

Embodiments of the invention provide an output driver for a semiconductor memory device that can effectively control the slew rate of an output signal according to a variation in the operating frequency.

BRIEF DESCRIPTION OF THE DRAWINGS

The above and other aspects and advantages of the invention will become more apparent by describing in detail preferred embodiments thereof with reference to the attached drawings.

DETAILED DESCRIPTION OF THE INVENTION

Figure 1:
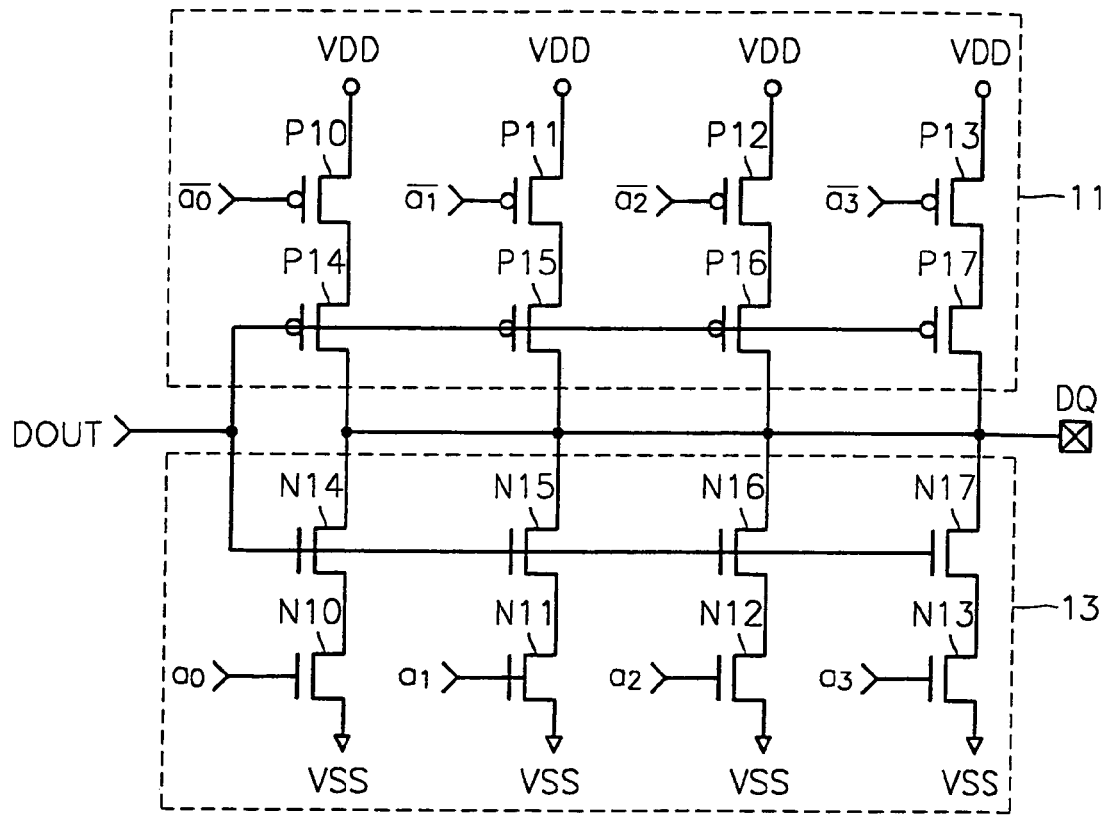
FIG. 1 shows an output driver according to an embodiment of the invention.
Figure 1:
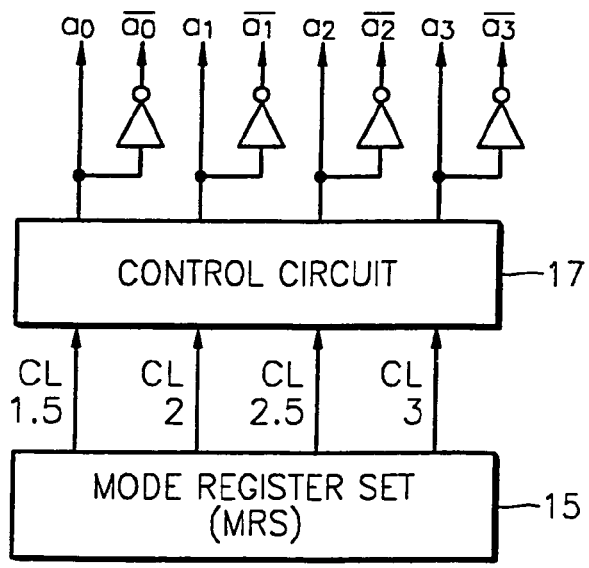

Hereinafter, the invention will be described in detail by describing preferred embodiments of the invention with reference to the accompanying drawings. Like reference numerals refer to like elements throughout the drawings.

FIG. 1 shows an output driver according to an embodiment of the invention. Referring to FIG. 1, the output driver according to this embodiment of the invention includes a pull-up driver 11, a pull-down driver 13, a mode register set (MRS) 15, and a control circuit 17.

The pull-up driver 11 is connected to an output terminal DQ and pulls-up the output terminal DQ. The pull-down driver 13 is connected to the output terminal DQ and pulls-down the output terminal DQ. The mode register set (MRS) 15 stores column address select (CAS) latency information CL1.5, CL2, CL2.5, and CL3 applied from outside a semiconductor memory device.

In particular, the driving capabilities of the pull-up driver 11 and the pull-down driver 13 are varied in response to the CAS latency information CL1.5, CL2, CL2.5, and CL3. More specifically, the control circuit 17 generates control signals a0, a1, a2, a3, /a0, /a1, /a2, and /a3 in response to the CAS latency information CL1.5, CL2, CL2.5, and CL3, and the driving capabilities of the pull-up driver 11 and the pull-down driver 13 are varied in response to the control signals a0, a1, a2, a3, /a0, /a1, /a2, and /a3.

The pull-up driver 11 includes a plurality of pull-up transistors P10, P11, P12, and P13, which are commonly connected to the output terminal DQ through PMOS switch transistors P14, P15, P16, and P17 and are selectively enabled in response to each of the control signals /a0, /a1, /a2, and /a3. The pull-down driver 13 includes a plurality of pull-down transistors N10, N11, N12, and N13, which are commonly connected to the output terminal DQ through NMOS switch transistors N14, N15, N16, and N17 and are selectively enabled in response to each of the control signals a0, a1, a2, and a3.

In a synchronous memory device, the CAS latency information CL1.5, CL2, CL2.5, and CL3 includes frequency information, i.e., information related to the period tCK of an operating clock signal. Table 1 shows an example of CAS latency information including frequency information. Table 2 shows logic states of control signals a0, a1, a2, and a3 according to CAS latency information CL1.5, CL2, CL2.5, and CL3.

TABLE 1

|       | Case 1    | Case 2    | Case 3     | Case 4    |
|-------|-----------|-----------|------------|-----------|
| TCK   | 5.0 nsec  | 6.0 nsec  | 7.5 nsec   | 10.0 nsec |
| CL3   | 15.0 nsec | 18.0 nsec | 22.5 nsec  | 30.0 nsec |
| CL2.5 | 12.5 nsec | 15.0 nsec | 18.75 nsec | 25.0 nsec |
| CL2   | 10.0 nsec | 12.0 nsec | 15.0 nsec  | 20.0 nsec |
| CL1.5 | 7.5 nsec  | 9.0 nsec  | 11.25 nsec | 15.0 nsec |

TABLE 2

|       | a0 | a1 | a2 | A3 |
|-------|----|----|----|----|
| CL3   | 1  | 1  | 1  | 1  |
| CL2.5 | 1  | 1  | 1  | 0  |
| CL2   | 1  | 1  | 0  | 0  |
| CL1.5 | 1  | 0  | 0  | 0  |

Hereinafter, the operation of the output driver according to the invention will be described in greater detail with reference to FIGS. 1 and 2.

For example, when CAS latency information stored in the MRS 15 applied from outside the semiconductor memory device is CL1.5, logic states of the control signals a0, a1, a2, and a3 generated in the control circuit 17 become (1,0,0,0). As a result, only the pull-up transistor P10 among the pull-up transistors P10, P11, P12, and P13 of the pull-up driver 11 is turned on, and only the pull-down transistor N10 among the pull-down transistors N10, N11, N12, and N13 of the pull-down driver 13 is turned on. That is, when the CAS latency information is small, the driving capabilities of the pull-up driver 11 and the pull-down driver 13 are reduced.

When the CAS latency information stored in the MRS 15 is CL3, logic states of the control signals a0, a1, a2, and a3 generated in the control circuit 17 become (1,1,1,1). As a result, all of the pull-up transistors P10, P11, P12, and P13 of the pull-up driver 11 are turned on, and all of the pull-down transistors N10, N11, N12, and N13 are turned on. That is, when the CAS latency information is large, the driving capabilities of the pull-up driver 11 and the pull-down driver 13 are increased.

As described above, in the output driver according to an embodiment of the invention, the driving capabilities of the pull-up driver 11 and the pull-down driver 13 are varied according to the CAS latency information CL1.5, CL2, CL2.5, and CL3. That is, when the CAS latency information is large, the number of turned-on pull-up transistors and the number of turned-on pull-down transistors are increased such that the slew rate of a signal output from the output terminal DQ is reduced. On the other hand, when the CAS latency information is small, the number of turned-on pull-up transistors and the number of turned-on pull-down transistors are reduced such that the slew rate of the signal output from the output terminal DQ is increased.

Figure 2:
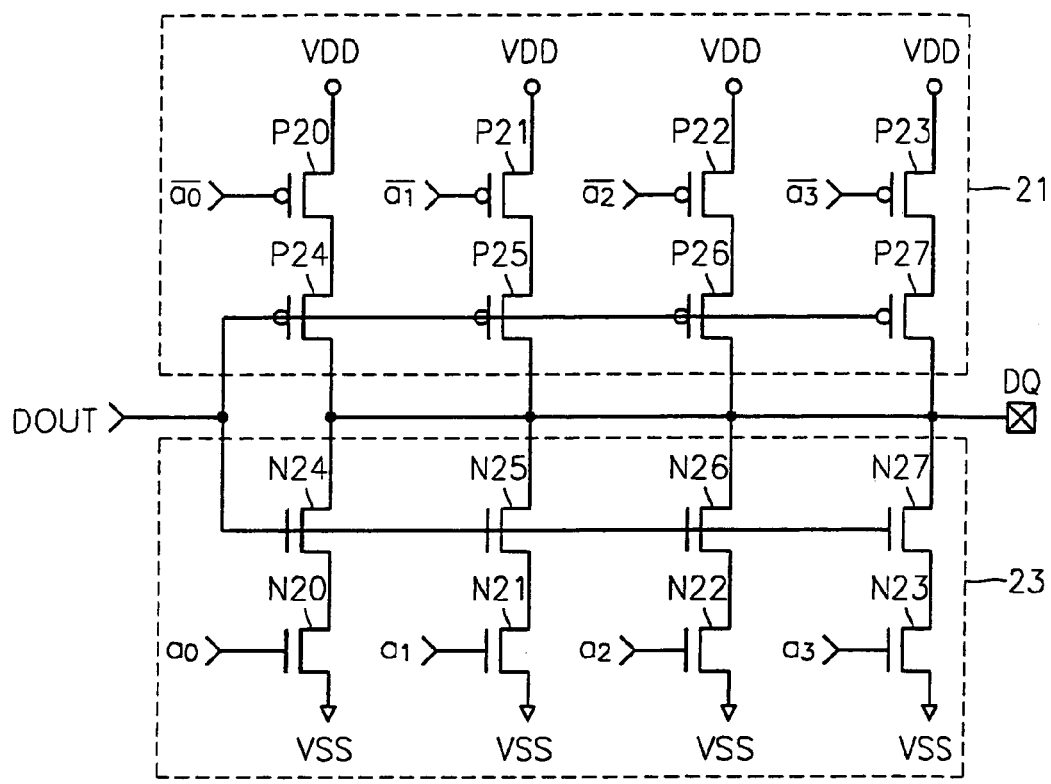
FIG. 2 shows an output driver according to another embodiment of the invention.
Figure 2:
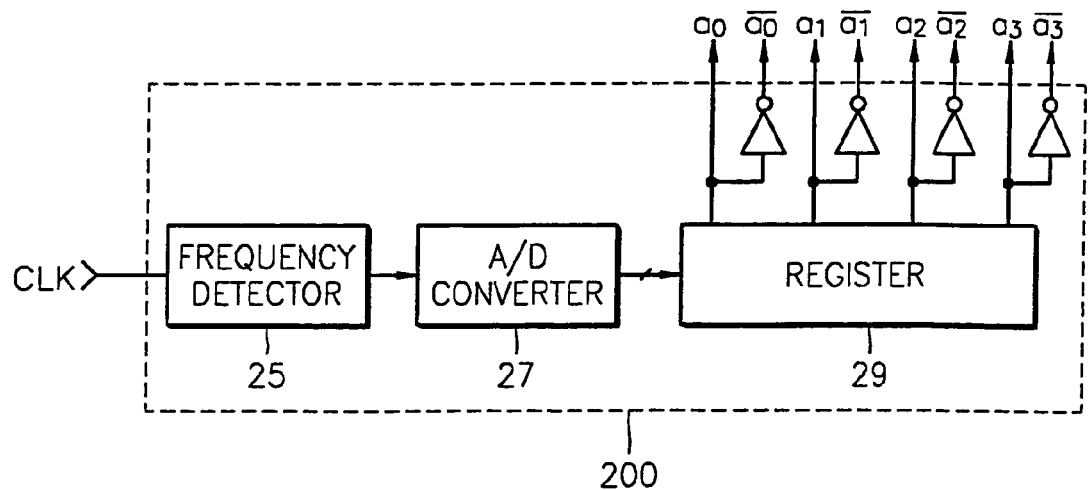

FIG. 2 shows an output driver according to another embodiment of the invention. Referring to FIG. 2, the output driver according to this embodiment includes a pull-up driver 21, a pull-down driver 23, and a frequency detecting unit 200.

The pull-up driver 21 is connected to the output terminal DQ and pulls-up the output terminal DQ. The pull-down driver 23 is connected to the output terminal DQ and pulls-down the output terminal DQ. The frequency detecting unit 200 detects and stores the frequency of an operating clock signal CLK, applied from outside a semiconductor memory device. In particular, the driving capabilities of the pull-up driver 21 and the pull-down driver 23 are varied in response to output signals a0, a1, a2, and a2, and /a0, /a1, /a2, and /a3 that are output from the frequency detecting unit 200.

More specifically, the frequency detecting unit 200 includes a frequency detector 25, an A/D converter 27, and a register 29. The frequency detector 25 detects the frequency of the operating clock signal CLK, and the A/D converter 27 converts a detected analog frequency signal into a digital signal. The register 29 stores the digital signal input from the A/D converter 27 and provides the stored control signals a0, a1, a2, a3, /a0, /a1, /a2, and /a3 to the pull-up driver 21 and the pull-down driver 23. The control signals a0, a1, a2, a3, /a0, /a1, /a2, and /a3 correspond to the control signals a0, a1, a2, a3, /a0, /a1, /a2, and /a3 illustrated in FIG. 1.

Like the first embodiment shown in FIG. 1, the pull-up driver 21 includes a plurality of pull-up transistors P20, P21, P22, and P23, which are commonly connected to the output terminal DQ through PMOS switch transistors P24, P25, P26, and P27 and are selectively enabled in response to each of the control signals /a0, /a1, /a2, and /a3. The pull-down driver 23 includes a plurality of pull-down transistors N20, N21, N22, and N23, which are commonly connected to the output terminal DQ through NMOS switch transistors N24, N25, N26, and N27 and are selectively enabled in response to each of the control signals a0, a1, a2, and a3.

More specifically, for example, when the frequency of the operating clock signal CLK applied from outside the semiconductor memory device is a predetermined high frequency, logic states of the control signals a0, a1, a2, and a3 output from the frequency detecting unit 200 become (1,0,0,0). As a result, only the pull-up transistor P20 among the pull-up transistors P20, P21, P22, and P23 of the pull-up driver 21 is turned on, and only the pull-down transistor N20 among the pull-down transistors N20, N21, N22, and N23 of the pull-down driver 23 is turned on. That is, when the frequency of the operating clock signal CLK is a predetermined high frequency, the driving capabilities of the pull-up driver 21 and the pull-down driver 23 are reduced.

When the frequency of the operating clock signal CLK applied from outside the semiconductor memory device is a predetermined low frequency, the logic states of the control signals a0, a1, a2, and a3 output from the frequency detecting unit 200 become (1,1,1,1). As a result, all of the pull-up transistors P20, P21, P22, and P23 of the pull-up driver 21 are turned on, and all of the pull-down transistors N20, N21, N22, and N23 of the pull-down driver 23 are turned on. That is, when the frequency of the operating clock signal CLK is a predetermined low frequency or a predetermined high frequency, the driving capabilities of the pull-up driver 21 and the pull-down driver 23 are increased.

As described above, in the output driver according to another embodiment of the present invention, the driving capabilities of the pull-up driver 21 and the pull-down driver 23 are varied according to the frequency of the operating clock signal CLK applied from outside the semiconductor memory device. That is, when the frequency of the operating clock signal CLK is low, the number of turned-on pull-up transistors and the number of turned-on pull-down transistors are increased such that the slew rate of a signal output from the output terminal DQ is reduced. On the other hand, when the frequency of the operating clock signal CLK is high, the number of turned-on pull-up transistors and the number of turned-on pull-down transistors are reduced such that the slew rate of the signal output from the output terminal DQ is increased.

As described above, in the output driver according to embodiments of the invention, a slew rate of an output signal can be effectively controlled according to CAS latency information including frequency information of an operating clock signal or according to frequency information obtained by detecting the frequency of the operating clock signal.

Embodiments of the invention will now be described in a non-limiting way.

According to one aspect of the invention, an output driver of a semiconductor memory device is provided. The output driver includes an output terminal, a pull-up driver that is connected to the output terminal and pulls-up the output terminal, a pull-down driver that is connected to the output terminal and pulls-down the output terminal, and a mode register set which stores CAS latency information of the semiconductor memory device. The driving capabilities of the pull-up driver and the pull-down driver are varied in response to the CAS latency information.

The pull-up driver includes a plurality of pull-up transistors, which are commonly connected to the output terminal and are selectively enabled in response to each of a plurality of control signals, and each of the control signals is generated according to the CAS latency information. The pull-down driver includes a plurality of pull-down transistors, which are commonly connected to the output terminal and are selectively enabled in response to each of a plurality of control signals, and each of the control signals is generated according to the CAS latency information.

According to another aspect of the invention, there is provided an output driver of a semiconductor memory device. The output driver includes an output terminal, a pull-up driver which is connected to the output terminal and pulls-up the output terminal, a pull-down driver which is connected to the output terminal and pulls-down the output terminal, and a frequency detector which detects and stores the operating frequency of the semiconductor memory device. Driving capabilities of the pull-up driver and the pull-down driver are varied in response to information stored in the frequency detector.

The pull-up driver includes a plurality of pull-up transistors, which are commonly connected to the output terminal and are selectively enabled in response to each of a plurality of control signals, and each of the control signals is generated according to the information stored in the frequency detector. The pull-down driver includes a plurality of pull-down transistors, which are commonly connected to the output terminal and are selectively enabled in response to each of a plurality of control signals, and each of the control signals is generated according to the information stored in the frequency detector.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. An output driver of a semiconductor memory device, the output driver comprising:
   an output terminal;
   a pull-up driver that is connected to the output terminal and pulls-up the output terminal;
   a pull-down driver that is connected to the output terminal and pulls-down the output terminal; and
   a frequency detector that detects and stores the operating frequency of the semiconductor memory device, wherein driving capabilities of the pull-up driver and the pull-down driver are varied in response to information stored in the frequency detector.

2. The output driver of claim 1, wherein the pull-up driver comprises a plurality of pull-up transistors, which are commonly connected to the output terminal and are selectively enabled in response to each of a plurality of control signals, wherein each of the control signals is generated according to the information stored in the frequency detector.

3. The output driver of claim 1, wherein the pull-down driver comprises a plurality of pull-down transistors, which are commonly connected to the output terminal and are selectively enabled in response to each of a plurality of control signals, wherein each of the control signals is generated according to the information stored in the frequency detector.

4. A method for driving the output of a semiconductor memory device comprising:
   pulling up an output terminal of the semiconductor memory device with a pull-up driver;
   pulling down the output terminal of the semiconductor memory device with a pull-down driver;
   detecting an operating frequency of the semiconductor memory device;
   storing the operating frequency; and
   varying a driving capability of the pull-up driver and the pull-down driver in response to the operating frequency.

* * * * *

UNITED STATES PATENT AND TRADEMARK OFFICE
CERTIFICATE OF CORRECTION

PATENT NO. : 7,133,318 B2 Page 1 of 1
APPLICATION NO. : 11/339120
DATED : November 7, 2006
INVENTOR(S) : Hoe-ju Chung et al.

It is certified that error appears in the above-identified patent and that said Letters Patent is hereby corrected as shown below:

Column 2, line 61, the word "A3" should read -- a3 --.

Signed and Sealed this

Second Day of September, 2008

JON W. DUDAS
*Director of the United States Patent and Trademark Office*